United States Patent [19]

Miyaoka et al.

[11] Patent Number: 4,982,361
[45] Date of Patent: Jan. 1, 1991

[54] MULTIPLE LOOP PARALLEL PIPELINED LOGIC SIMULATION SYSTEM

[75] Inventors: Shinichiro Miyaoka; Akira Muramatsu, both of Kawasaki; Motohisa Funabashi, Sagamihara, all of Japan

[73] Assignee: Hitachi, Ltd., Tokyo, Japan

[21] Appl. No.: 789,832

[22] Filed: Oct. 21, 1985

[30] Foreign Application Priority Data

Oct. 26, 1984 [JP] Japan .................................. 59-223918

[51] Int. Cl.$^5$ .......................... G06F 15/16; G06F 9/38; G06F 9/28
[52] U.S. Cl. .................................. 364/900; 364/916.3; 364/933.8; 364/221.1; 364/232.3; 364/264.3; 364/931.4; 364/931.0; 364/231.8; 364/263.0
[58] Field of Search ... 364/200 MS File, 900 MS File, 364/578; 371/23

[56] References Cited

U.S. PATENT DOCUMENTS

| | | | |
|---|---|---|---|
| 4,070,705 | 1/1978 | Lockwood et al. | 364/200 |
| 4,087,794 | 5/1978 | Beausoleil et al. | 364/200 |
| 4,229,790 | 10/1980 | Gilliland et al. | 364/200 |
| 4,247,941 | 1/1981 | Raymond | 364/200 |
| 4,306,286 | 12/1981 | Cocke et al. | 364/200 |
| 4,308,616 | 12/1981 | Timoc | 371/23 |
| 4,342,093 | 7/1982 | Miyoshi | 364/578 |
| 4,351,025 | 9/1982 | Hall | 364/200 |
| 4,365,297 | 12/1982 | Grisham | 364/200 |
| 4,396,978 | 8/1983 | Hammer | 364/200 |
| 4,466,063 | 8/1984 | Segarra | 364/200 |
| 4,584,642 | 4/1986 | Fudanuki | 364/200 |
| 4,587,625 | 5/1986 | Marino, Jr. et al. | 364/578 |
| 4,590,581 | 5/1986 | Widdoes, Jr. | 371/20 |
| 4,604,718 | 8/1986 | Norman et al. | 364/578 |
| 4,635,218 | 1/1987 | Widdoes, Jr. | 364/578 |
| 4,644,487 | 2/1987 | Smith | 364/578 |
| 4,656,580 | 4/1987 | Hitchcock et al. | 364/200 |
| 4,656,632 | 4/1987 | Jackson | 371/20 |
| 4,751,637 | 6/1988 | Catlin | 364/200 |
| 4,763,288 | 8/1988 | Deering | 371/20 |
| 4,783,741 | 11/1988 | Mitterauer | 364/300 |
| 4,785,416 | 11/1988 | Stringer | 371/20 |
| 4,788,683 | 11/1988 | Hester et al. | 371/20 |
| 4,873,630 | 10/1989 | Rusterholz | 364/200 |

OTHER PUBLICATIONS

19th Design Automation Conference, 1982 IEEE, The Yorktown Simulation Engine: Introduction, Gregory F. Pfister, pp. 51–59.
20th Design Automation Conference, 1983 IEEE, HAL; A Block Level Hardware Logic Simulator, by Tohru Sasaki, et al., pp. 150–156.
Gurd et al, "Data Driven System for High Speed Parallel Computing–Part 1: Structuring Software for Parallel Execution", Computer Design, Jun. 1980, pp. 91–100.
Gurd et al, "Data Driven System for High Speed Parallel Computing–Part 2: Hardware Design", Computer Design, Jul. 1980, pp. 97–106.
Kai Hwang, "Computer Architecture and Parallel Processing", McGraw-Hill, 1984, pp. 32–35, 374–375, 396–399, 448–449, 452–453, 762–763.
R. Barto et al., *A Computer Architecture for Digital Logic Simulation*, Electronic Engineering (vol. 52, No. 642, Sep. 1980), pp. 35–36, 41, 45, 47, 50, 54, 56, 60, 63, 66.

*Primary Examiner*—Archie E. Williams, Jr.
*Assistant Examiner*—Eric Coleman
*Attorney, Agent, or Firm*—Antonelli, Terry, Stout & Kraus

[57] ABSTRACT

The present invention is capable of registering and reading out a logical element for which the state of the output pin changes. The system includes an input side reading out circuit for reading out the kind of logical element and the states of all the input pins thereof, a decision circuit for deciding the presence of the output pin that the status change is produced on when a logical operation is carried out according to the kind of logical element, an output side reading out circuit for reading out the information related to the logical element of the output pin producing the status change, and an exchange sending circuit for sending each information read out from the output side reading out circuit to the desired registering and reading out circuit for precise high speed logic simulation of a large scale logic circuit containing MOS-type logical elements.

8 Claims, 4 Drawing Sheets

MULTIPLE LOOP PARALLEL PIPELINED LOGIC SIMULATION SYSTEM

BACKGROUND OF THE INVENTION

1. Field of the Invention

The present invention relates to a logic circuit simulator, particularly, to a special purpose processor suitable for high speed simulation of a large scale gate level circuit.

2. Background of the Invention

Documents describing special purpose processors for logic simulation of one gate level (G. F. Pfister: The Yorktown Simulation engine, 19th Design Automation Conference) and one functional level [Sasaki: Summary of the High Speed Simulator (HAL), The 26th National Conference of Information Processing] have been published. A well-known example of the former which is similar to the present invention has the disadvantage of being unable to precisely effect logic simulation of a MOS element circuit, because only unit delay or three-value (0, 1, indefinite) simulation can be carried out thereby.

SUMMARY OF THE INVENTION

The purpose of the present invention is to provide a special purpose processor for high speed and precise simulation of a large scale logic circuit containing MOS elements.

Logic simulation is divided into four processes, (1) registration and read out of activated logical elements, (2) read out of the type of elements (AND, OR, etc) and the state the input pins, (3) logical operation of the elements and decision of output status change, (4) read out of the output side elements and of a delay time. These are effected by special purpose hardware, and data or operating instructions are circulated according to the sequence of (1)→(2)→(3)→(4)→(1)—for high speed logic simulation.

DETAILED DESCRIPTION OF THE PREFERRED EMBODIMENTS

Figure 1:
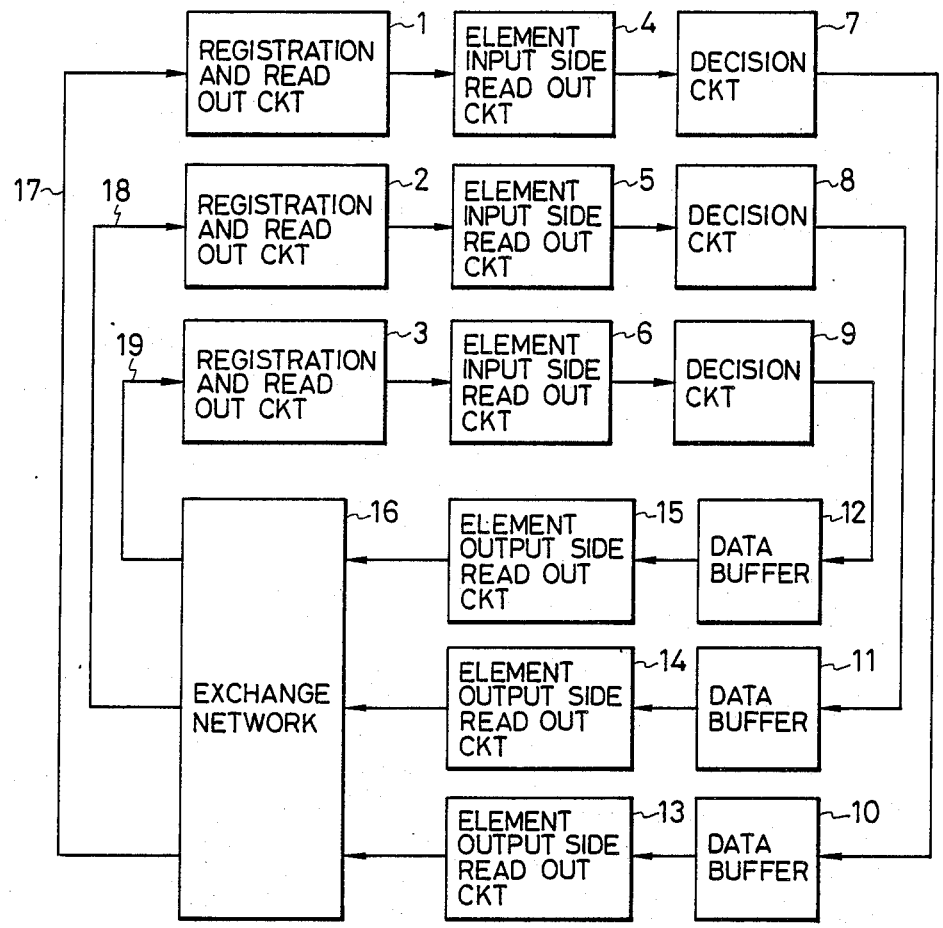
FIG. 1 is a structural drawing of an embodiment of a logic simulator based on the present invention.

In an embodiment shown in FIG. 1, an overall operating processor is composed of a triple loop.

The first (or the second or the third, read the numbers in this order in parentheses hereinafter) loop 17 (18, 19) is composed of a registration and read out CKT 1 (2, 3) for registering and reading out the activated element; an element input side read out CKT 4 (5, 6) for reading out the kind of the element and the state of the input pin; a decision CKT 7 (8, 9) for a logical operation of the element and for deciding the presence of output status change; a FIFO data buffer 10 (11, 12); an element output side read out CKT 13 (14, 15) for reading out the element to be output and the delay time; and an exchange network 16.

It is assumed that a logic simulation circuit is divided into as many sub-circuits as the number of loops. The data for the kind of element, the connecting structure, and the delay time are divided corresponding to the subgraph, assigned to each one of the loops, and stored in the processor of the corresponding loop.

Figure 2:
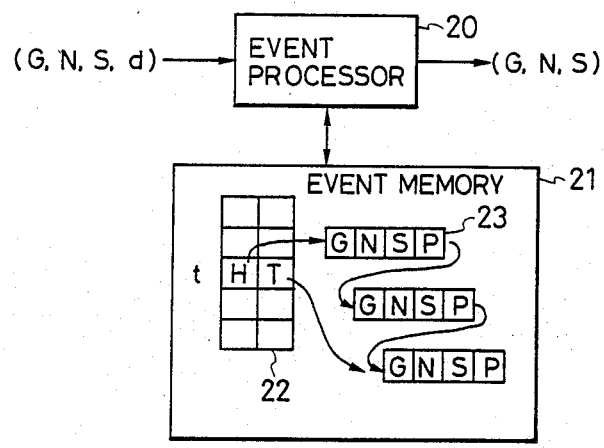
FIG. 2 is a block diagram of circuits 1 to 3 shown in FIG. 1.

Next, the structure of each one of the circuits is described. Each of the circuits 1 to 3 is composed of an event processor 20 and an event memory 21, as shown in FIG. 2. The event memory 21 comprises a time wheel 22 which is individually accessible and an event list 23. In the time wheel 22, a head pointer H and a tail pointer T of the event list is stored, corresponding to each time. In the event list 23, the number of the activated element G, the input pin number N showing the status change of the element, and a status value S of the input pin are connected by a pointer P to be stored. If the four values [Driving, Resistive, High Impedance, X (indefinite)] are considered as a strength besides the level 0, 1, and X (indefinite) to provide $3 \times 4 = 12$ values-for the status value S, a sufficient precision for processing MOS can be obtained.

Figure 3:
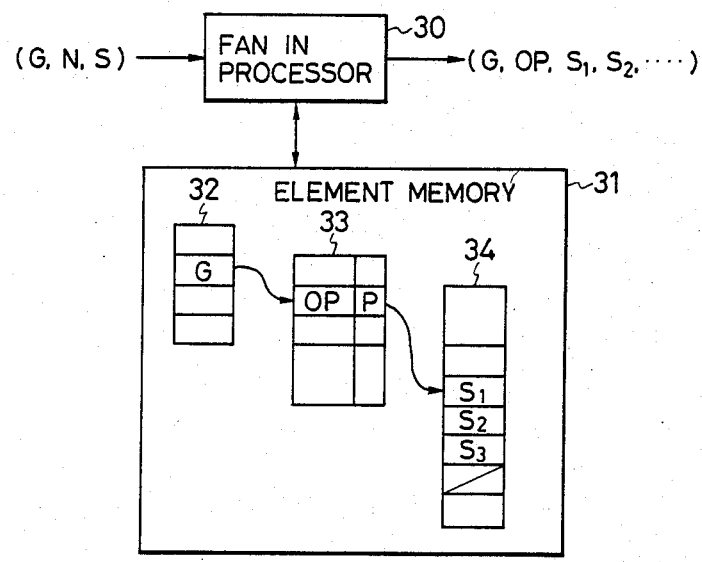
FIG. 3 is a block diagram of circuits 4 to 6 shown in FIG. 1.

The circuits 4 to 6 are composed of a fan in processor 30 and an element memory 31, as shown in FIG. 3. The element memory 31 is composed of an activated element list 32, which is individually accessible, an element kind table 33, and an input value table 34. The element number G is stored in the activated element list, the element kind OP and the pointer P of the input table are stored in the element kind table, and the status of the input pins of all the element $S_1, S_2, \ldots$ are stored in the input value table.

Figure 4:
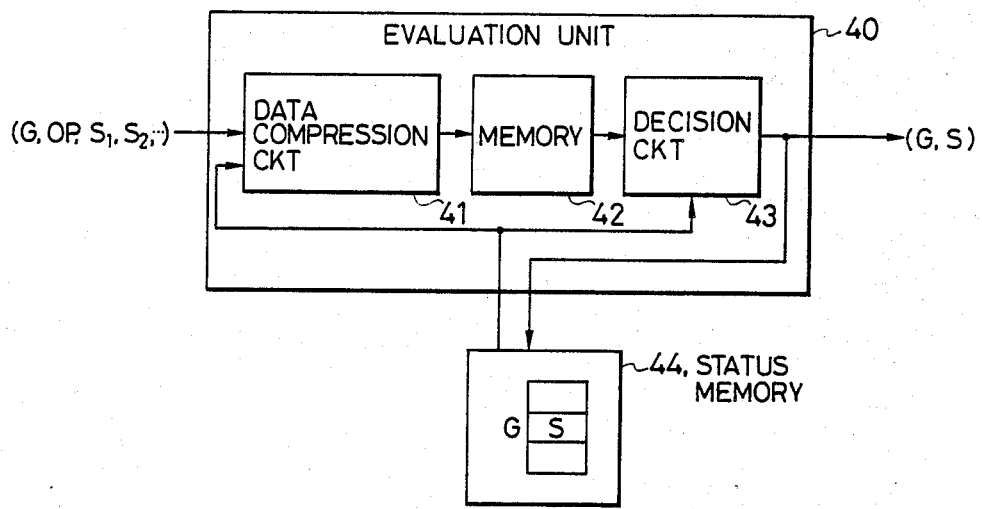
FIG. 4 is a block diagram of circuits 7 to 9 shown in FIG. 1.

The circuits 7 to 9 are composed of an evaluation unit 40 and a status memory 44, as shown in FIG. 4. The evaluation unit 40 is composed of a data compression CKT for compressing the data of the input signal, a memory 42 for storing a true value for each element, and a decision circuit 43 for deciding the presence of the status change of output. The data compression CKT is provided for excluding a combination of a redundancy or meaningless input and for decreasing the memory capacity required for the true value table. The status of the output pin of the element is stored in the status memory 44, corresponding to the element number.

Figure 5:
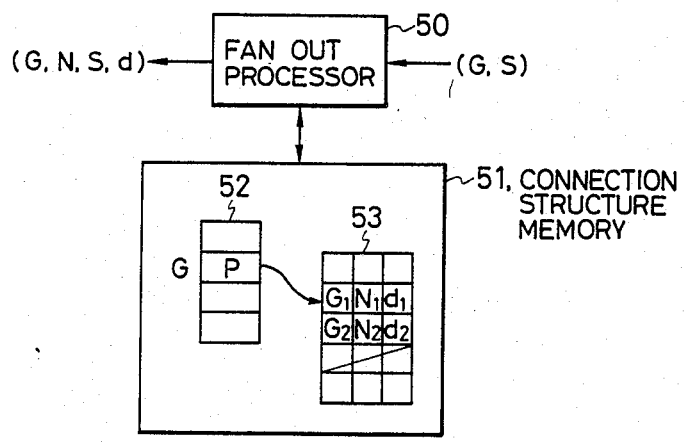
FIG. 5 is a block diagram of circuits 13 to 15 shown in FIG. 1.

The circuits 13 to 15 are composed of a fan-out processor 50 and a connecting structure memory 51, as shown in FIG. 5. The connecting structure memory 51 is composed of a pointer table 52, which is individually accessible, and a table to be output 53. The pointer P of the table to be outputted is stored in the pointer table and the number of elements to be output, the input pin number of the element, and the delay time d are stored in the table to be output. Furthermore, propagation delay time is also considered as the delay time to provide a value such that the propagation delay time is added to the delay time of the element to be output. The output is complicated, and termination of the reading out of the table to be output is decided by an END flag in the stored data.

The exchange network 16 distributes the input data according to the address in a header part, and is composed of a multiple step network or a crossbar switch.

Figure 6:
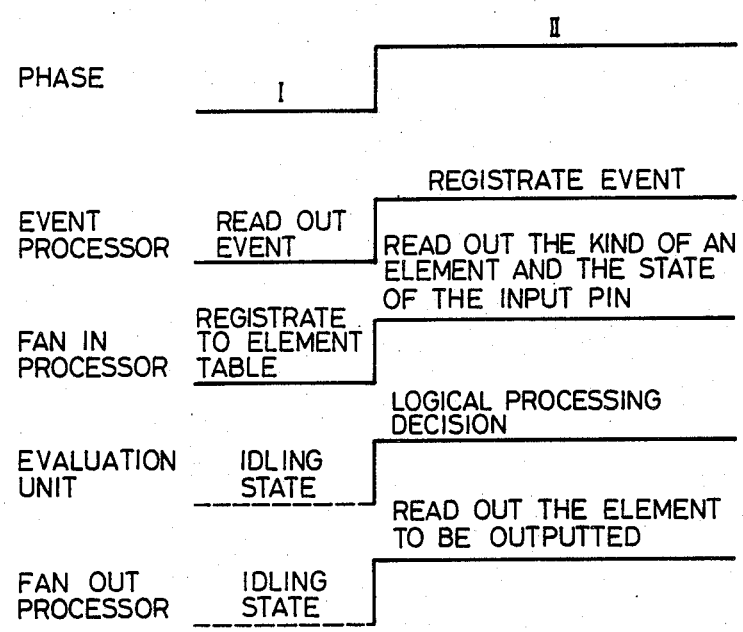
FIG. 6 is an operating explanatory drawing of the present invention.

The operation of each one of the above-described parts is divided into two phases, as shown in FIG. 6. In phase I, only the event processor and the fan-in processor are operated and the evaluation unit and the fan-out processor are in an idling state. In phase II, all the processors operate at the same time.

The operations in phase I will be described according to FIGS. 2 and 3. First, the event processor 20 in FIG. 2 reads out the number of element G activated at the current time t, the input pin number N, and the input pin state S and feeds out the combination of (G,. N, S) to the fan-in processor. The fan-in processor 30 receives the combination of (G, N, S) and writes G in the activated element list 32 and S in the input value table 34. When this operation terminates for all the input pins of the activated element, phase I is complete.

Next, the operations in the phase II will be described according to FIGS. 2 to 5. The fan-in processor 30 reads out the element number G for the element registered in the activated element list, the kind OP, and the status of all the input pins of the element $S_1, S_2, \ldots$ from the element memory 31 and feeds out the combination of (G, OP, $S_1, S_2, \ldots$). When there are many input points, it is preferable to provide a function that enables sending them separately. The evaluation unit 40 receives the combination of (G, OP, $S_1, S_2, \ldots$) and inputs them to the data compression circuit 41. The values read out from the status memory 44 are simultaneously inputted when the internal states are required for logical operations such as a flip-flop. The output of the data compression circuit 41 becomes the address of the true value table memory 42 and the value read out from the memory 42 becomes a new output of the element. Accordance or discordance of the present output and the previous output is checked by the decision circuit 43, and if there is a change, a new output value S is stored in the status memory 44, while the combination of (G, S) is sent to the data buffer. The fan-out processor 50 of FIG. 5 fetches the combination of (G, S) then reads out the number of the element to be output G, the pin number N, and the delay time d from the connection structure memory 51, and sends out the combination of (G, N, S, d) to the exchange network 16. When all data has been outputted, the next combination of (G, S) is fetched from the data buffer.

The exchange network 16 decodes the element number G and sends out the combination of (G, N, S, d) to any one of the three event processors. That is to say, the data is sent out to the event processor connected to the event memory which stores the information related to G. The event processor 20 of FIG. 2 receives the combination of (G, N, S, d), calculates the estimated time of activation t+d from the present time t and the delay time d, and then registers (G, N, S) with the event list of this time.

The above-described operations are effected by a pipe-line method along a loop. That is to say, in phase I, the event processor and the fan-in processor, and in phase II, the event processor, the fan-in processor, the evaluation unit, the fan-out processor, and the exchange network simultaneously conduct the operation for the different elements.

The above operations are described with regard to one loop, but calculations proceed in parallel with the exchange of data through the exchange network. If more parallel processing is desired, the number of loops can be increased without a major modification of the structure.

Not shown in FIG. 1, the calculation device is connected to a host computer, for example, (a micro-computer) which loads data into memory, reads out results, and controls exchanges between phases I and II.

The present invention can resolve the problems inherent in parallel processing to effect maximum calculation so that it can effect high speed logic simulation. For example, a large computer corresponding to the M200-H class effects simulation at $5 \times 10_4$ elements/ second. In contrast, the present invention can effect simulation at $1.2 \times 10_7$ element/second four loops and at $4.8 \times 10_7$ element/second 16 loops, provided that the machine cycle is 100 ns.

As compared with the well-known special purpose processor of logic simulation (G. F. Pfister: The Yorktown Simulation Engine, described before), the well-known example can process only a unit delay, whereas the present invention can process a standard delay containing a propagation delay. Furthermore, precise simulation becomes possible because the present invention can process many statuses.

According to the present invention, less hardware is required due to its limited purpose, and the degree of parallel processing is easily improved.

We claim:

1. A high speed logic simulator for simulating operation of a logic circuit including a plurality of logic elements, each of the logic elements having at least one input pin and one output pin, said logic simulator comprising:

at least one registration and read out circuit means for storing a first information set corresponding to a first activated logic element, the first information set including a first logic element number for the first activated logic element, an input pin number for each input pin of said first activated logic element and a status value representing the status of each input pin of said first activated logic element, said at least one registration and read out circuit means including means for reading the first information set;

at least one first processing means for receiving the first information set read out from said at least one registration and read out means, said at least one first processing means including means for storing the first logic element number, the status value for each input pin of said first activated logic element, and a type value representing the type of said first activated logic element, and means for reading out the first logic element number, the status value of each input pin and the type value as a second information set;

at least one decision circuit means for receiving the second information set read out from said at least one first processing means, said at least one decision circuit means including means for storing output status data corresponding to said first activated logic element, means for generating an output corresponding to an output of said first activated logic element based on the received second information set, means for determining whether the generated output represents a change in the output of said first activated logic element based on the stored output status data, means for updating the stored output status data if a change in the output of said first activated logic element is detected, and means for outputting a third information set including the first activated logic element number and the output status data;

at least one second processor means for receiving the third information set output from said at least one decision circuit means and for outputting a fourth information set corresponding to a second activated logic element based on the received third information set, the fourth information set including a second activated logic element number for the second activated logic element, an input pin number for each input pin of said second activated logic element having a status change due to the output status change of said first activated logic element, and a delay time corresponding to at least the propagation delay of said second activated logic element, said at least one second processor means including means for outputting the fourth information set; and control means for transferring the fourth information set to said at least one registration and read out means based on the second activated logic element number, wherein said at least one registration and read out means further includes means for calculating an event time period for said second activated logic element based on a present time value and the delay time.

2. A high speed logic simulator according to claim 1, wherein the status values for at least one input pin of said first and second activated logic elements correspond to one of an undefined, driving, resistive and high impedance status.

3. A high speed logic simulator for simulating operation of a combination circuit including a plurality of logic elements each of which has at least one input pin and one output pin, said logic simulator comprising:

at least one first means including means for receiving a first number corresponding to a first logical element which has the status of one input pin thereof changed at a predetermined time, a second number corresponding to the changed input pin, the status of the changed input pin, and a delay time of said first logical element including a propagation delay time thereof, means for calculating an activated time of said first logical element, a first memory, means for storing in said first memory at a memory address corresponding to the delay time a set of values including the first number, the second number, and the status of said changed input pin, and means for reading out the first set of values from said first memory;

at least one second means including means for receiving the first set of values from said first means, a second memory, means for storing in said second memory a second set of values including the first number, the kind of logical element designated by the first number, and the status of the one input pin of said first logical element, and means for reading out the second set of values from said second memory;

at least one third means including means for receiving the second set of values from said second means, means for detecting a change in the status of an output pin of said first logical element, a third memory, means for storing in said third memory, at a memory address corresponding to the first number, a third set of values including a new status value for the output pin of said first logical element, and means for outputting a third set of values including the first number and the new status value;

at least one fourth means including means for receiving the third set of values from said third means, a fourth memory, means for reading out, from an address of said fourth memory designated by the first number, a new first number corresponding to a second logical element, a new second number for said second logical element, and a new delay time of said second logical element, and means for outputting a fourth set of values including the new first number, the new second number, the new status value and the new delay time; and at least one fifth means for relaying the fourth set of values from said fourth means to said first means.

4. A high speed logic simulator according to claim 3, wherein at least two sets of said first, second, third and fourth means are connected in parallel with each other to said fifth means.

5. A high speed logic simulator according to claim 4, wherein said fifth means includes an exchange network for relaying the fourth set of values from one of said fourth means to a desired one of said first means.

6. A high speed logic simulator according to claim 3, wherein said at least one third means includes a buffer memory for temporarily storing the third set of values.

7. A high speed logic simulator according to claim 3, wherein the status values of each logic element include at least one of the values corresponding to a driving status, resistive status, high impedance status and indefinite status.

8. A high speed logic simulator according to claim 3, wherein the value corresponding to the status values of each logical element includes one of four values corresponding to driving status, resistive status, high impedance status and indefinite status.

* * * * *